United States Patent
Ying et al.

(10) Patent No.: US 6,187,659 B1
(45) Date of Patent: Feb. 13, 2001

(54) NODE PROCESS INTEGRATION TECHNOLOGY TO IMPROVE DATA RETENTION FOR LOGIC BASED EMBEDDED DRAM

(75) Inventors: Tse-Liang Ying; Wen-Chuan Chiang, both of Hsin-Chu; Cheng-Ming Wu, Kao-Hsiung; Yu-Hua Lee, Hsinchu, all of (TW)

(73) Assignee: Taiwan Semiconductor Manufacturing Company, Hsin-Chu (TW)

( * ) Notice: Under 35 U.S.C. 154(b), the term of this patent shall be extended for 0 days.

(21) Appl. No.: 09/368,861

(22) Filed: Aug. 6, 1999

(51) Int. Cl.[7] ................................................. H01L 21/4763
(52) U.S. Cl. ........................ 438/618; 438/629; 438/672; 438/675
(58) Field of Search ..................................... 438/618–681

(56) References Cited

U.S. PATENT DOCUMENTS

| | | |
|---|---|---|
| 5,599,736 | 2/1997 | Tseng ................................ 437/186 |
| 5,795,827 | 8/1998 | Liaw et al. ........................... 438/663 |
| 5,854,102 | 12/1998 | Gonzalez et al. ..................... 438/237 |
| 5,893,734 | 4/1999 | Jeng et al. ............................ 438/239 |
| 5,930,675 * | 7/1999 | Hada ..................................... 438/647 |
| 6,030,894 * | 2/2000 | Hada et al. ........................... 438/675 |

* cited by examiner

*Primary Examiner*—Jey Tsai
(74) *Attorney, Agent, or Firm*—George O. Saile; Stephen B. Ackerman

(57) ABSTRACT

A new method is provided to create a gradated dopant concentration in the contact plug of DRAM devices whereby a high dopant concentration is present at the bottom of the plug and a low dopant concentration is present at the top of the plug. Two layers of dielectric are deposited; the upper layer serves as a layer to adjust the dopant concentration in the lower layer. This adjustment is done by Rapid Thermal anneal of both layers of dielectric. After the dopant concentration has been adjusted, the upper layer of dielectric is removed and the upper section of the contact node is formed using lightly doped poly. The high dopant concentration at the bottom of the contact plug results in low contact resistance between the plug and the underlying silicon substrate. A low dopant concentration at the top surface of the contact plug results in low oxidation of the surface of the plug.

17 Claims, 5 Drawing Sheets

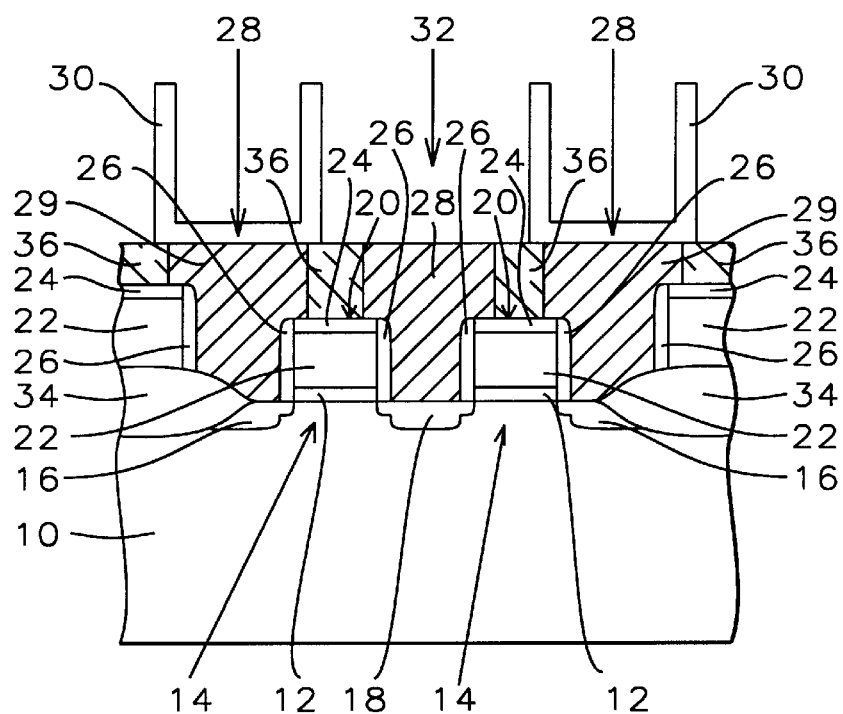
FIG. 1 – Prior Art

NODE PROCESS INTEGRATION TECHNOLOGY TO IMPROVE DATA RETENTION FOR LOGIC BASED EMBEDDED DRAM

BACKGROUND OF THE INVENTION (1) Field of the Invention

The invention relates to the fabrication of integrated circuit devices, and more particularly, to a method to reduce contact node resistance thereby improving data retention for logic-based DRAM devices.

(2) Description of the Prior Art

For the mass production of semiconductor integrated devices many devices are typically concurrently produced by the simultaneous creation of device features in silicon substrates. In this creation of device features, materials having vastly different characteristics and electrical properties are used to provide the different functions for each of the device features. Categories of materials that are used for this purpose are materials that are electrically conducting, non-conducting or semiconducting. The substrate on Which these devices are created is most commonly of silicon, the silicon can be either of single crystalline structure or of poly crystalline structure, both of these crystalline structures can be made to become electrically conducting by doping the silicon with impurities. These impurities can be of different electrical types and can contain fewer electrons ("holes") in their molecular structure than silicon or the impurities can contain more electrons in their molecular structure than silicon. The former (for instance boron or indium) creates p-type silicon after the silicon is doped with this impurity; the latter (for instance phosphorous or arsenic) creates n-type silicon.

The functions that are performed by data processing systems can broadly be divided into the function of manipulating data, the logic function, and the function of retaining or storing data, the memory function. While these functions can at times be encountered on one and the same semiconductor chip, these function are in many cases provided by chips that are specifically dedicated to either one or to the other function.

The Dynamic Random Access Memory (DRAM) is typically used for the function of data storage and consists of arrays of memory cells that form two basic functions, that is the field effect transistor that serves as a charge transfer transistor and a capacitor. The field effect transistor (a source region, a drain region and a gate electrode) serves the function of providing access to the capacitor whereby the capacitor serves the function of data retention or storage. Binary data is stored as electrical charge on the capacitor in the individual DRAM memory cells. Contacts to the surrounding circuits are provided for the DRAM memory cell. DRAM memory is so named because its cells can retain information only for a limited period of time before they must be read and refreshed at periodic intervals. In a typical DRAM construction, one side of the transistor i s connected to one side of the capacitor. The other side of the transistor and the transistor gate electrode are connected to external connect points that form the bit and word line. The other side of the capacitor is connected to a reference voltage.

The processing technology in the manufacturing of Dynamic Random Access Memory (DRAM) has, during the last several decades, migrated from 0.8 um 4M memories to 0.25 um 256M memories with a continuing decrease in memory cell size and concurrent increase in memory capacity. It is expected that in the near future the number of memory cells that can be fabricated on one chip will increase to 1 Gigabit. This scaling down in memory cell capacity puts increased emphasis on the dielectric isolation between the DRAM cells since this dielectric isolation im pact s data retention capability. Semiconductor manufacturing processing efficiencies are enhanced by reductions in device feature size, in t his effort the capacitor of the DRAM device is usually the largest element of the Integrated Circuit chip. For bit densities of up to one megabit, planar-type storage capacitors are used. However, as storage densities increase, the amount of charges needed for a sufficient noise margin remains fixed. Therefore, in order to increase the specific capacitance, two different routes have been taken. The first is to store charges vertically in a trench. The second solution, which allows the cell to shrink in size without losing storage capacity, is to stack the capacitor on top of the access transistor. It is apparent from this that, as the memory density increases; the capacitor structure becomes more intricate and grows in the vertical direction.

DRAM storage cell capacity can be increased by making the capacitor dielectric thinner, by using a dielectric with a larger dielectric constant or by increasing the area of the capacitor. The first two options are not currently available since capacitor dielectrics thinner than those now being used in DRAM cells will suffer leakage due to an electron tunneling effect. Dielectrics with significantly larger dielectric constants than that of $SiO_2$ have not yet been accepted for DRAM application.

It must also be noted that, since the 256-kbit DRAM generation, bi-layer films (consisting of both silicon nitride and $SiO_2$) have been used as the capacitor dielectric to increase cell capacitance. The higher dielectric constant of $Si_3Ni_4$ (twice as large as that of $SiO_2$) is responsible for this increase.

The approach of storing charges vertically in a trench results in stacking the storage capacitor on top of the access transistor. The lower electrode of the stacked capacitor (STC) is in contact with the drain of the access transistor whereby the bit line runs over the top of the stacked capacitor. For STC cells to be made feasible for larger capacity DRAM's, an insulator with a larger dielectric constant than that of $SiO_2$ must be used.

The invention addresses the formation of the plugs that make contact with the capacitor and the bit or word lines in the highlighted construction of a DRAM device. FIGS. 2 through 4 shows a number of Prior Art methods that are applied for this process.

FIG. 2 shows a cross section of the present process of the formation of plug 43. FIG. 2a shows how the current process creates the lightly doped region 40 of polysilicon and the High Temperature Film (HTF) 41 for the formation of plug 43, layers 42 and 44 can represent an adjacent gate electrode and an underlying stress relieve layer respectively. The structure shown in FIG. 2 has been created on the surface of a silicon substrate 47. The HTF region 41 is heavily doped and formed at a temperature of about 750 degrees C. FIG. 2b shows the poly plug after polishing. FIG. 2c shows the creation of a second plug on top of the first plug. The layer of lightly doped poly 40 has been extended with a second layer 43 of lightly doped poly over which the capacitor structure 45 has been created. The top surface of the HTF region 41 has formed a layer of native oxide that typically forms on heavily doped poly, this layer of oxide increases the contact resistance between the two layers 40/41 and 43 in the region 46. This increase in contact resistance degrades device performance.

FIG. 3 shows another current approach in forming contact plugs. In using lightly doped poly, the thermal budget for the process can be reduced. FIG. 3 shows a process where lightly doped poly has been used. FIG. 3a shows the typical plug 46 formation, FIG. 3b shows the plug after CMP of the top surface of the plug, FIG. 3c shows the plug after the plug 46 has been extended with a second layer 48 of lightly doped poly and the capacitor 50 has been created in contact with the second layer 48 of poly. The reduced thermal budget that can be used for this process has however increased the node contact resistance (between layers 46 and 48) which again degrades device performance.

FIG. 4 shows yet another approach that can be used to make contact plugs. FIG. 4a shows how the plug 52, made using lightly doped poly, is implanted (51) with an n-type dopant, region 53 in the geometric center of the plug indicates the region where the dopant concentration is heaviest. FIG. 4b shows the plug after CMP, FIG. 4c shows the plug after the plug 52 has been extended with a second layer 54 of poly and connected to capacitor 56. The dopant distribution 53 in the lower section of the plug is uneven with low concentration of dopant at the interface between the plug and the underlying silicon 47. The dopant also has a low concentration at the top region 55 of the lower section of the plug where the first layer of the plug intersects with the second, lightly doped, second layer 54. This results in an increase of the contact resistance of this portion of the overall plug. In addition, the implant of the dopant into the section 52 (FIG. 4a) has caused molecular lattice network damage to section 52 which further increases the contact resistance at the intersect between 54 and 55. These effects degrade device performance.

The invention address a method for forming contact plugs whereby device performance is not degraded. Typically lightly doped poly is used for the formation of the highlighted DRAM device plugs. It is however the tendency in the formation of logic imbedded DRAM devices to reduce the thermal budget for the process, this results in increased contact resistance. Increased contact resistance results in low charge efficiency making data retention more difficult to achieve.

SUMMARY OF THE INVENTION

A principle objective of the invention is to create a poly contact plug that does not degrade DRAM device performance.

Another objective of the invention is to avoid oxidation of the top surface of the contact plug in DRAM devices thereby avoid degrading DRAM device performance.

Yet another objective of the invention is to create a gradated dopant profile in the contact plug of DRAM devices thereby creating lower contact resistance between the contact plug and the underlying silicon.

In accordance with the objectives of the invention a new method is provided to create a DRAM device contact plug with a gradated dopant profile. A high dopant concentration is present at the bottom of the plug and a low dopant concentration is present at the top of the plug. Two layers of dielectric are deposited; the upper layer serves as a layer to adjust the dopant concentration in the lower layer. This adjustment is done by Rapid Thermal Anneal of both layers of dielectric. After the dopant concentration has been adjusted, the upper layer of dielectric is removed and the upper section of the contact node is formed using lightly doped poly. The high dopant concentration at the bottom of the contact plug results in low contact resistance between the plug and the underlying silicon substrate. A low dopant concentration at the top surface of the contact plug results in low oxidation of the surface of the plug.

U.S. Pat. No. 5,599,736 (Tseng) shows a poly plug process using an initially undoped poly plug, doping the poly plug and removing the doped poly.

U.S. Pat. No. 5,795,827 (Liaw et al.) shows a triple poly plug process.

U.S. Pat. No. 5,893,734 (Jeng et al.) and U.S. Pat. No. 5,854,102 (Gonzalez et al.) show poly plug contact processes.

BRIEF DESCRIPTION OF THE DRAWINGS

FIG. 1 shows a cross section of a partially completed DRAM device.

DESCRIPTION OF THE PREFERRED EMBODIMENTS

Figure 2A:
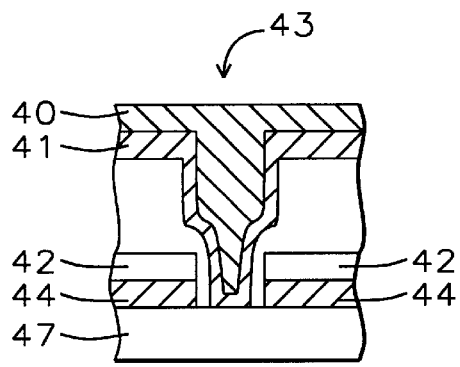
FIGS. 2a–2c show a Prior Art formation of a poly contact plug for DRAM devices.
Figure 2B:
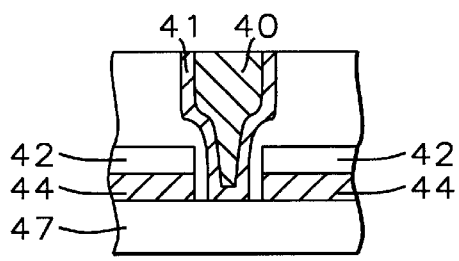
Figure 2C:
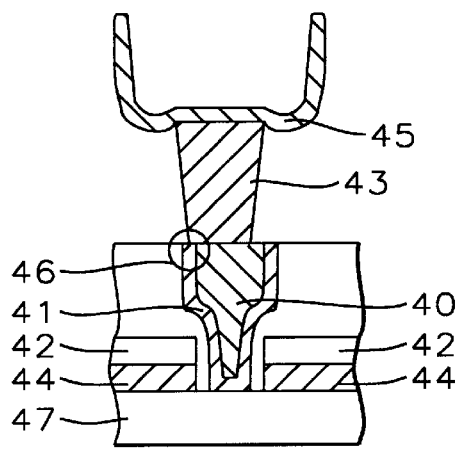
Figure 3A:
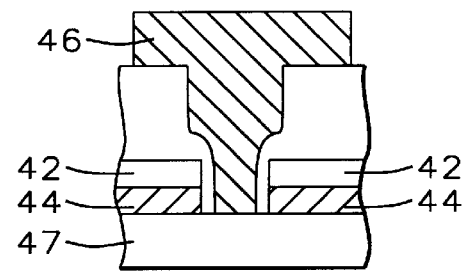
FIGS. 3a–3c show another Prior Art formation of a poly contact plug for DRAM devices.
Figure 3B:
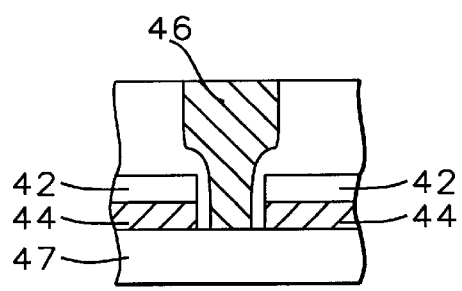
Figure 3C:
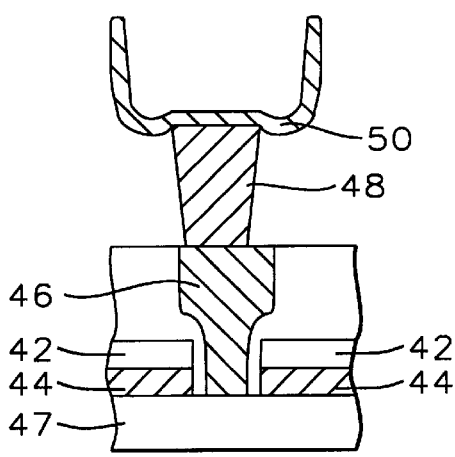
Figure 4A:
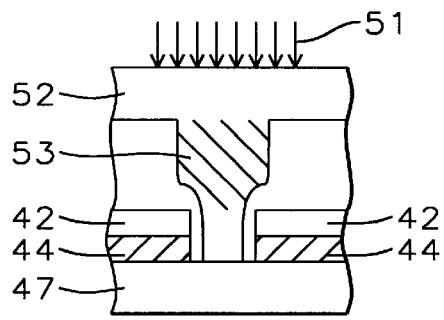
FIGS. 4a–4c show yet another Prior Art formation of a poly contact plug for DRAM devices.
Figure 4B:
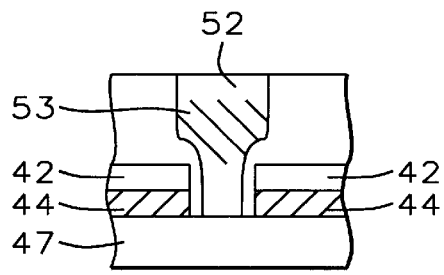
Figure 4C:
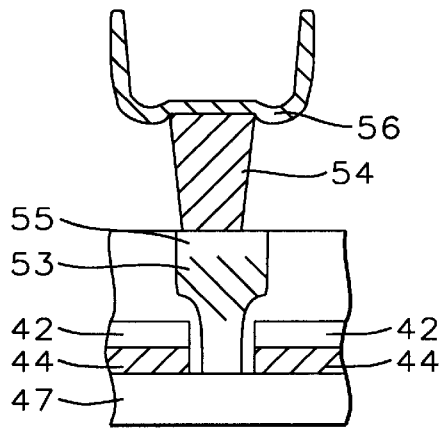

A typical construction of a DRAM memory cell region is shown in FIG. 1. Shown in FIG. 1 is a lightly doped p$^-$ type single crystal silicon substrate 10 with a crystallographic orientation of <100>. The highlighted DRAM memory region is electrically isolated from its peripheral regions by Field Oxide (FOX) regions 34 that surround the memory region. The FOX region is typically formed by forming Shallow Trench Isolation regions in the surface of the substrate 10 by etching trenches that are typically between 2000 and 4000 angstrom deep. The trenches are lined with a layer of thin thermal oxide and filled with an insulating material such as silicon dioxide. The surface of the trenches is then polished (using CMP technology) and made equal in elevation with the surface of the surrounding silicon. A thin layer of gate oxide 12 (between about 40 and 90 Angstrom thick) is next grown over the device area of the surface of the substrate 10 to serve as stress relieve layer. The gate structure of the transistors 14 contains the typical gate structure elements of source (16) and drain (18) regions (formed by implanting an n$^+$ type dopant into these regions), the gate electrodes 20 that contain a (n$^+$ doped) polysilicon layer 22 and a silicide layer 24 (to make electrical contact with the top of the gate electrode) and gate spacers 26. The doping of layer 22 can use arsenic or phosphorous as a dopant, typically with a concentration of between 1.0E20 and 1.0E21 atoms/cm$^3$ and an energy between about 30 and 70 KeV. The polysilicon layer is typically between about 500 and 1500 Angstrom thick and is deposited using (Low Pressure Chemical Vapor Deposition (LPCVD) technology. A refractory metal silicide layer (not shown), preferably of tungsten silicide (WSi$_2$) or tungsten hexafluoride (WF$_6$) to a thickness of between about 500 and 2500 Angstrom, can be deposited on the layer of poly is deposited using LPCVD. A cap oxide layer (not shown) can be deposited on top of the refractory metal silicide; this layer typically contains SiO$_2$ and has a top layer of SiN$_4$ with a thickness of between about 1000 and 2500 Angstrom. The poly layer and the overlying layers are patterned using conventional photolithographic techniques and anisotropic etching to form the poly gate structures over the active area of the silicon substrate while forming word lines over the FOX regions 34.

The insulating sidewall spacers 26 are typically formed by depositing a layer of $Si_3N_4$ using LPCVD and anisotropically etching the layer of $Si_3N_4$. The layer of $Si_3N_4$ is deposited to a thickness of between about 200 and 800 Angstrom.

The source/drain regions 16/18 are formed by ion implant using an n-type dopant such as $p^{31}$ whereby the process of doping is self-aligned with the formed gate structure. The contacts 16/18 are typically doped to a final dopant concentration of between about 1.0E19 and 1.0E21 atoms/$cm^3$.

The Contact regions 28 are provided to establish contact between the source regions 16 and capacitors 30, contact region 32 provides access to the drain region 18. Contact 32 forms the bit line contact also referred to as the bit-line self aligned contact. Contacts 28 form the storage capacitor contacts also referred to as the storage node self aligned contacts. Capacitor contacts 28 and bit line contact 32 are typically filled with doped polysilicon to form the capacitor contact 28 and the bit line 32 contacts respectively. Field isolation regions 34 isolate the active transistors 14 from the surrounding areas of the silicon substrate. Regions 36 form isolation regions that can for instance contain boro-phospho-silicate-glass (BPSG) or any other suitable isolation material.

Further highlighting the formation of a typical DRAM structure, a relatively thin layer (not shown) of $Si_3N_4$ can be deposited over the created gate electrode structures and the exposed surface of the substrate using LPCVD and a gas mixture such as dichlorosilane ($SiCl_2H_2$) and ammonia ($NH_3$). This layer can be deposited to a thickness of between 50 and 500 Angstrom. After this, a relatively thick insulating layer 36, typically of borophosphodsilicate (BPSG), can be deposited using LPCVD with tetraethosiloxane (TEOS) as a reactant gas. Boron and phosphorous are added during the deposition of the BPSG layer. Layer 36 is then chemically/mechanically polished to provide a planarized surface where layer 36 has a thickness of between 4500 and 9000 Angstrom over the surface of the gate electrodes.

The insulating layer 36 must now be etched to create openings for the contact plugs to form the bit-line and storage node self-aligned contacts. A layer of photoresist is therefore deposited over the surface of layer 36, this layer of photoresist is masked to the pattern of the contact plugs and anisotropically etched to etch the self-aligned openings for contact plugs 29 and 32. For the etch of the photoresist, plasma etching is preferred using Reactive Ion Etching (RIE) with as etchant a gas mixture containing perfluoroisobutylene ($C_4F_8$), trofluoromethane ($CHF_3$), methyflouroride ($CH_3F$), carbon tetrafluoride ($CF_4$), carbon monoxide (CO), oxygen ($O_2$) and argon (Ar). This etch results in forming the pattern 32 for the self-aligned bit-line contact and the pattern 28 for the self-aligned storage node contact.

Referring now specifically to FIG. 5, there is shown a sequence of steps that is provided under the invention to create a poly contact plug that does not degrade DRAM device performance.

Figure 5A:
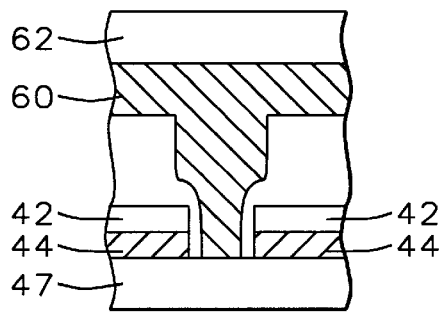
FIGS. 5a–5d show the formation of a contact poly plug under the invention.

FIG. 5a shows a cross section of the poly plug where the plug is formed using two layers of poly. The first layer 60 is created using heavily doped poly, the second and overlying layer is formed using lightly doped poly.

The heavily doped layer 60 is created by depositing a layer of polysilicon using LPCVD processing to a thickness of between about 2000 and 4000 Angstrom at a temperature between about 550 and 750 degrees C.; an ion implant procedure, using $PH_3$ at an energy between about 20 and 80 KeV and a dose between about 5E14 and 5E15 atoms/$cm^3$ is used to dope the poly layer. An in-situ doped layer of polysilicon can also be used for this deposition.

The lightly doped layer 62 is created by depositing a layer of polysilicon using LPCVD processing to a thickness of between about 2000 and 4000 Angstrom at a temperature between about 550 and 750 degrees C.; an ion implant procedure, using $PH_3$ at an energy between about 20 and 80 KeV and a dose between about 1E14 and 5E14 atoms/$cm^3$ is used to dope the poly layer. An in-situ doped layer of polysilicon can also be used for this deposition.

Figure 5B:
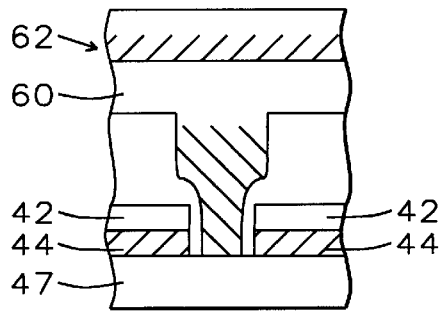

FIG. 5b shows how the concentration of the doping in the two layers of poly, that is layer 60 and layer 62, is controlled and modified by thermally moving the dopant concentration. The top layer 62 has, as indicated, been created using lightly doped poly thereby reducing the thermal budget for the process. The top layer 62 serves the function of buffering the subsequent modification of the dopant profile. The dopant concentration in layer 62 is important because this dopant is moved to the lower regions of layer 62 and, in so doing, depletes the dopant in the top region of layer 60. This results in low dopant concentration in the top region of layer 60 and, since most of the dopant in layer 60 has been removed from the top region and moved into the bottom region of layer 60, a high concentration of dopant is present in the lower region of layer 60. This is the desired result. By concentrating the doping in the lower layer 60, in the area where this layer intersects with the underlying silicon 47, low contact resistance is assured between the silicon 47 and section 60 of the poly plug. The process of moving the dopant concentration in the manner indicated is a process of Rapid Thermal anneal (RTA) that is performed in a nitric or inert gas atmosphere at a temperature between about 700 and 750 degrees C. for a period of between about 30 seconds and 2.0 minutes. This process can also be performed using a furnace at a temperature between about 700 and 750 degrees C. for a time of about 30 minutes. Other inert ambients that can be used for this purpose can be Ar, He, Ne, Kr, Xe, $H_2$ or a mixture thereof.

The processing conditions for moving the dopant concentration are as follows: temperature between about 650 and 700 degrees C., time of exposure between about 30 seconds and 2 minutes, an $N_2$ ambient is used at a pressure of between about 700 and 800 Torr.

Layer 60 above the dielectric over which it is deposited is typically about 4000 Angstrom thick; layer 62 is typically about 2000 Angstrom thick.

Figure 5C:
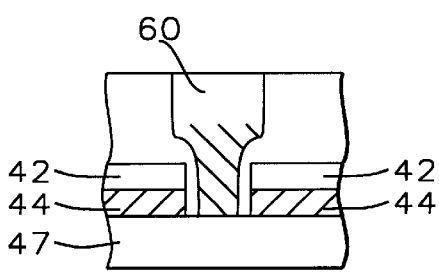

FIG. 5c shows a cross section of the poly plug after the removal of the top layer 62 (FIG. 5b) from the structure. This removal has also partially removed the top surface of the lower layer 60 and has resulted in a surface of layer 60 that has low dopant concentration and is therefore not prone to surface oxidation. The poly CMP for the removal of layer 62 will typically be stopped at or slightly below the surface of the oxide layer.

Figure 5D:
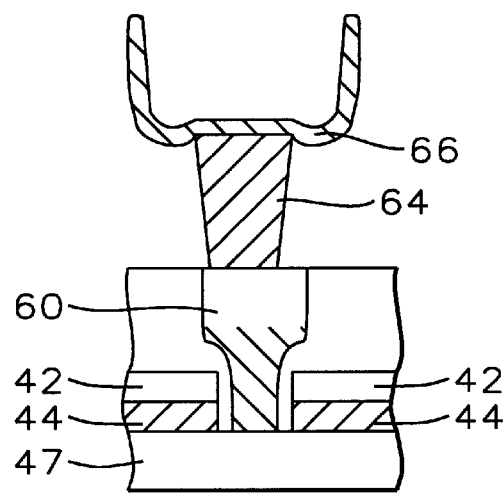

FIG. 5d shows a cross section of the completed plug in accordance with the invention. The second section 64 of the contact plug is created on the surface of the first section 60 of the contact plug. The second section 64 contains lightly doped poly making its surface not exposed to oxidation. The formation of layer 64 follows standard practice techniques of deposition, patterning and etching. The top surface of the lower section 60 has, as previously indicated, low dopant concentration. This results in very limited oxidation of the surface since native oxide in the surface of layer 60 is largely absent. The lower region of the layer 60 has a high concentration of dopant resulting in low contact resistance of the poly structure with the underlying silicon. The overall effect of the doping implant and the subsequent modification of the dopant profile in the poly contact is twofold: one it has provided a poly plug of improved device performance by decreasing the contact resistance between the plug and the underlying silicon, two the surface of the plug will not oxidize. Both effects result in improved device performance for the DRAM devices in which contact node are created in accordance with the invention.

The same processing conditions that have previously been highlighted for the creation of layer 62 also apply to the creation of layer 64.

FIG. 6 shows further detail of the formation of the contact plug under the invention. This process starts using a semiconductor 10 on the surface of which have been formed two gate electrodes 70 and 72, FIG. 6a. An insulating layer 74 is deposited over the surface of the gate electrodes and patterned and etched in accordance with the pattern for the contact opening 75.

Figure 6A:
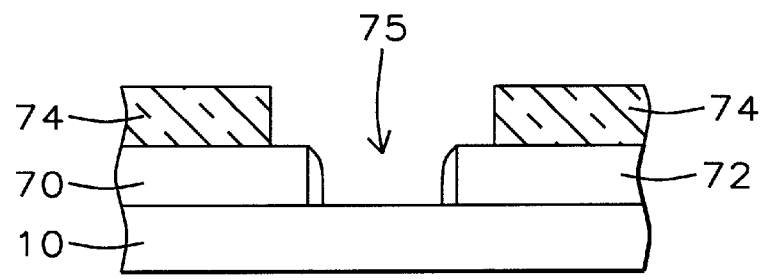
FIGS. 6a–6e show further detail of the formation of a contact plug in accordance with the invention.
Figure 6B:
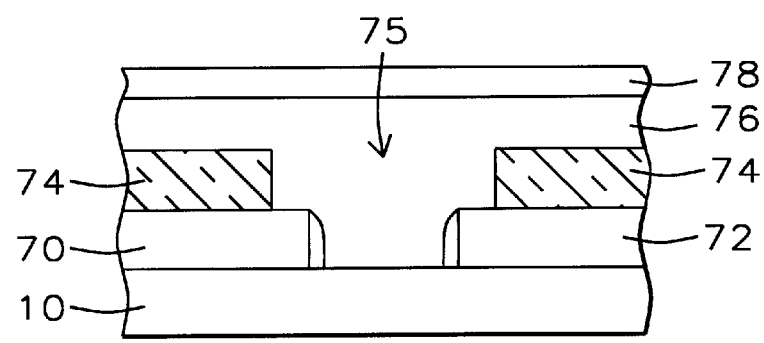

FIG. 6b shows how, after opening 75 has been created, a first layer of highly doped polysilicon 76 is deposited, filling opening 75 and overlying the top surface of layer 74. A second layer 78 of lightly doped polysilicon or amorphous Si is deposited over the surface of first layer of dielectric 76. Layer 78 serves as the dosage adjustment layer during the following step of RTA. The substrate is then submitted to a heat exposure in a furnace or to the process of Rapid Thermal Anneal (RTA), this process of RTA drives the dopant species and changes the dopant profile as previously highlighted. After this RTA process has been completed the top portion of layer 76 is removed.

Figure 6C:
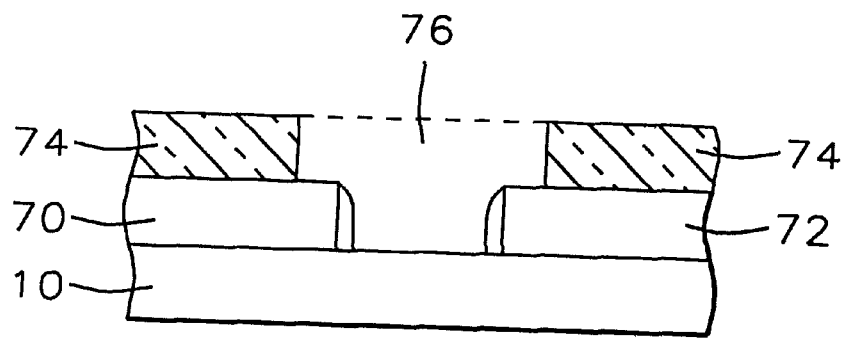

FIG. 6c shows the cross section after the completion of the removal of the top portion of layer 76.

Figure 6D:
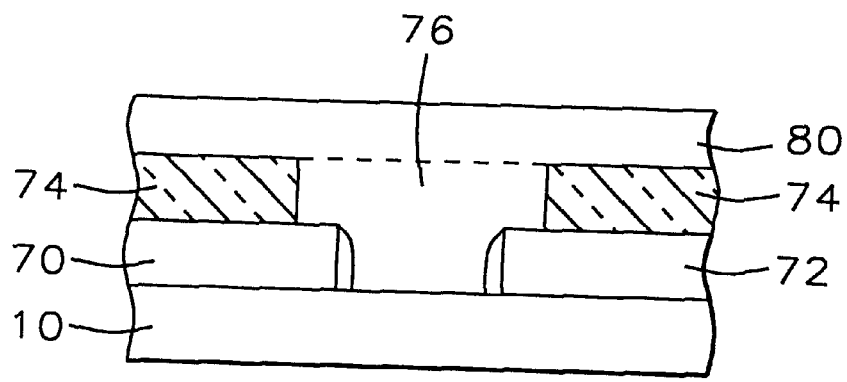

FIG. 6d shows the deposition of a third layer 80 of lightly doped polysilicon over the surface that has been created under FIG. 6c. This layer is patterned and etched again in accordance with the pattern of the contact opening 75 (FIGS. 6a and 6b).

The layer 80 of lightly doped poly becomes part of the contact plug where this layer overlays the lower part 76 of the contact plug. Layer 80 is therefore patterned and etched in accordance with the upper portion of the contact plug, the lightly doped layer 80 is removed from above the layer 74 of insulation where the lightly doped poly does not form part of the upper portion of the contact plug 82 (FIG. 62). For those regions where the lightly doped layer 80 is removed, a layer 84 (FIG. 6e) of dielectric or insulation can be used.

Figure 6E:
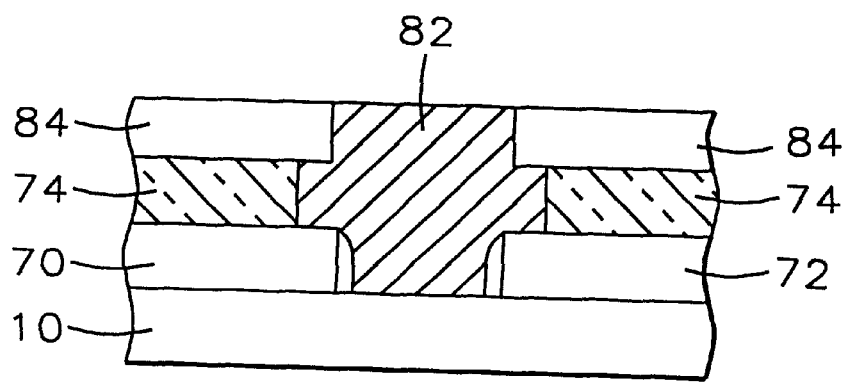

FIG. 6e shows a cross section of the contact plug 82 that has been formed between the two gate electrodes 70 and 72 in accordance with the invention. It is clear that the profile of this contact plug 82 is essentially the profile of the contact plug 64/60 as shown in FIG. 5d.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method for forming contact nodes in semiconductor devices, said contact nodes having a lower layer and an upper layer, comprising the steps of:

providing a semiconductor substrate;

creating partially completed structures on the surface of said substrate;

creating said lower layer of said contact nodes by depositing a first layer of polysilicon over said partially completed structure thereby including said contact openings within said partially completed structure, by depositing a second polysilicon over said first layer of polysilicon, by performing a Rapid Thermal Anneal to said first layer and said second layer of polysilicon and by removing said second of polysilicon, partially removing said first layer of polysilicon, creating said lower layer of said contact node, creating a plane of intersection between said lower layer and said upper layer of said contact node; and creating said upper layer of said contact node.

2. The method of claim 1 wherein said devices are logic embedded DRAM devices.

3. The method of claim 1 wherein said creating partially completed structures on the surface of said substrate is:

forming Field Isolation Regions thereby isolating the active areas from the surrounding areas of said silicon substrate;

creating a layer of gate oxide on the surface of said active regions of said substrate;

depositing a layer of polysilicon as a single layer or in combination with layers of any other suitable conductive gate electrode material over said gate oxide;

patterning and etching said layer of polysilicon or other suitable layers of conductive gate electrode material thereby forming gate electrode structures;

forming LDD regions for source and drain regions of gate electrodes by light implanting of dopants into these regions said implanting being self-aligned with said gate electrode structures;

forming gate spacers on sidewalls of said gate electrode structures, creating contact openings between said gate electrode structures;

completing formation of source and drain regions of the gate electrodes by heavy implanting of dopants into these regions said implanting being self-aligned with said gate electrode structures;

depositing a layer of insulation over said gate electrode structures, including said contact opening between said gate electrode structures; and patterning said layer of insulation, removing said layer of insulation from said contact openings between said gate electrodes structures, creating openings in said layer of insulation that align with said contact openings between said gate electrode structures.

4. The method of claim 1 wherein said first layer of polysilicon is a layer of heavily doped polysilicon.

5. The method of claim 1 wherein said first layer of polysilicon is a layer of lightly doped polysilicon.

6. The method of claim 3 wherein said Rapid Thermal anneal (RTA) is performed in a nitric or inert gas atmosphere at a temperature between about 700 and 750 degrees C. for a period not longer than about 30 seconds thereby creating a gradated dopant concentration in the first layer of dielectric with a high concentration of dopant in the first layer of dielectric where this dielectric interfaces with the surface of said substrate and a low concentration of dopant where this dielectric interfaces with said second layer of dielectric.

7. The method of claim 1 wherein said creating said upper layer of said contact node is;
   depositing a layer of lightly doped polysilicon over said plane of intersection between said lower layer and said upper layer of said contact node; and
   patterning said lightly doped polysilicon to form said upper layer of said contact node said upper layer of said contact node to align with said lower layer of said contact node.

8. A method for forming contact nodes in semiconductor devices, said contact nodes having a lower layer and an upper layer, comprising the steps of:
   providing a semiconductor substrate;
   creating partially completed logic based embedded DRAM structures on the surface of said substrate said partially completed DRAM structures to contain gate electrodes with gate spacers and gate source and drain regions with gate and source/drain regions contact openings;
   depositing a layer of insulation material over said partially completed logic based embedded DRAM structures, including said contact openings;
   patterning and etching said layer of insulation material, creating openings in said layer of insulation material that align with said contact openings;
   depositing a layer of heavily doped polysilicon over said layer of insulation material thereby including said contact openings;
   depositing a layer of lightly doped polysilicon over said layer of heavily doped polysilicon;
   performing a Rapid Thermal Anneal to said heavily and said lightly doped layers of polysilicon in a nitric or inert gas atmosphere at a temperature between about 700 and 750 degrees C. for a period between about 30 seconds and 2 minutes or by furnace exposure;
   removing said lightly doped layer of polysilicon, partially removing said heavily doped layer of polysilicon, creating said lower layer of said contact node, creating a plane of intersection between said lower layer and said upper layer of said contact node;
   depositing a layer of lightly doped polysilicon over said plane of intersection between said lower layer and said upper layer of said contact node; and
   patterning said lightly doped polysilicon to form said upper layer of said contact node said upper layer of said contact node to align with said lower layer of said contact node.

9. A method for fabricating a logic based embedded DRAM on the surface of a semiconductor substrate, forming conductive plugs containing an upper and lower section to provide electrical contact between an active region in said semiconductor substrate and interconnection metalization, comprising the steps of:
   providing partially completed DRAM devices on the surface of said substrate said partially completed DRAM devices having openings for said conductive plugs;
   providing said active region in said partially completed DRAM devices;
   depositing a first layer of polysilicon on said layer of insulation including said openings for said conductive plugs;
   depositing a second layer of polysilicon over said first layer of polysilicon;
   performing a Rapid Thermal Anneal of said first and said second layer of polysilicon;
   removing said second layer of polysilicon thereby partially removing said first layer of polysilicon thereby creating an interface thereby futhermore creating said lower section of said conductive plugs;
   depositing a third layer of polysilicon over said surface; and
   patterning said third layer of polysilicon to from said upper of said conductive plug.

10. The method of claim 9 wherein said providing a partially completed DRAM devices is:
    forming isolation regions in the surface of said substrate thereby surrounding and electrically isolating active device areas of said DRAM devices;
    growing a thin film of gate oxide on the surface of said substrate and within said active device areas; depositing a layer of polysilicon or other suitable conductive gate electrode material over said layer of gate oxide;
    patterning said layer of polysilicon or other suitable conductive gate electrode material thereby forming gate electrodes;
    forming insulating gate spacers on sidewalls of said gate electrodes, creating contact openings between said gate electrodes;
    forming source/drain regions for said electrodes, completing DRAM gate electrodes;
    depositing a layer of insulation over said DRAM gate electrodes including said openings for said conductive plugs; and
    pattering said layer of insulation, removing said insulation material from above said conductive plugs, creating openings in said layer of insulation that align with said openings for said conductive plugs.

11. The method of claim 10 with the additional steps of depositing a layer of refractory metal silicide over which a layer of cap oxide is deposited said additional steps to be performed after said step of patterning said layer of polysilicon or other suitable conductive gate electrode material.

12. The method of claim 9 wherein said depositing a first layer of polysilicon on said DRAM device is depositing a heavily doped layer of polysilicon.

13. The method of claim 9 wherein said depositing a second layer of polysilicon on said first layer of polysilicon is depositing layer that is selected from the group of a-Si and lightly doped polysilicon.

14. The method of claim 9 wherein said performing a Rapid Thermal Anneal of said first and said second layer of polysilicon is heating said first and second polysilicon layers to a temperature of between about 650 and 700 degrees C. for a period of time between about 30 seconds and 2 minutes or by furnace exposure in an ambient of an inert gas that is selected from the group comprising $N_2$, Ar, He, Ne, Kr, Xc, $H_2$ or a mixture thereof.

15. The method of claim 9 wherein said removing said second layer of polysilicon is applying CMP to the surface of said second layer of polysilicon thereby removing said second layer of polysilicon thereby furthermore partially removing said first layer of polysilicon thereby leaving in place the lower extremities of said first layer said lower extremities being within said conductive plug of polysilicon thereby furthermore creating an interface layer.

16. The method of claim 9 wherein said patterning said third layer of polysilicon to form said conductive plug is patterning and etching said third layer of polysilicon thereby creating the upper the upper section of said conductive plug whereby said upper section aligns with said lower section of said conductive plug.

17. A method of forming a conductive plug in an opening provided for this purpose in a layer of dielectric said conductive plug forming the electrical interface between an overlying layer or contact point of interconnect metal said conductive plug having an upper section and lower section, comprising the steps of:

depositing a layer of insulation over said layer of dielectric;

patterning said layer of insulation, removing said layer of insulation from above said underlying layer or contact point of interconnect metal, creating openings in said layer of insulation that align with said underlying contact point of interconnect metal;

blanket depositing a first layer of heavily doped polysilicon over the surface of said layer of insulation thereby including said openings in said dielectric;

depositing a second layer of lightly doped polysilicon over said first layer;

performing a Rapid Thermal Anneal to said first and said second layers;

removing said second layer of lightly doped polysilicon thereby futhermore partially removing said first layer of heavily doped polysilicon to where the surface of said first layer of heavily doped polysilicon is equal to or below the surface of said layer of insulation thereby creating the lower section of said conductive plug, creating a plane of interface between said lower and said upper section of said conductive plug;

depositing a third layer of lightly doped polysilicon over said plane of interface thereby including the surface of said layer of insulation; and patterning said third layer of lightly doped polysilicon to form said upper section of said conductive plug whereby said upper section of said conductive plug aligns with said lower section of said conductive plug.

* * * * *